United States Patent
Behrens et al.

(10) Patent No.: US 7,885,991 B2
(45) Date of Patent: Feb. 8, 2011

(54) DIGITAL FILTER HAVING A FIR FILTER AND A WARPED FIR FILTER, AND A LISTENING DEVICE INCLUDING SUCH A DIGITAL FILTER

(75) Inventors: Thomas Behrens, Hellerup (DK); Ulrik Kjems, Hellerup (DK); Thomas Bo Elmedyb, Hellerup (DK)

(73) Assignee: Oticon A/S, Smorum (DK)

( * ) Notice: Subject to any disclaimer, the term of this patent is extended or adjusted under 35 U.S.C. 154(b) by 1229 days.

(21) Appl. No.: 10/547,687

(22) PCT Filed: Mar. 3, 2004

(86) PCT No.: PCT/DK2004/000141

§ 371 (c)(1),
(2), (4) Date: Jul. 28, 2006

(87) PCT Pub. No.: WO2004/079901

PCT Pub. Date: Sep. 16, 2004

(65) Prior Publication Data

US 2007/0094319 A1    Apr. 26, 2007

(30) Foreign Application Priority Data

Mar. 4, 2003    (DK) ................................. 2003 00338

(51) Int. Cl.
*G06F 17/10* (2006.01)
(52) U.S. Cl. ..................................................... 708/301
(58) Field of Classification Search .......... 708/333–323
See application file for complete search history.

(56) References Cited

U.S. PATENT DOCUMENTS

| 5,771,299 A | 6/1998 | Melanson |
| 6,061,477 A * | 5/2000 | Lohmeyer et al. ........... 382/300 |
| 2005/0249272 A1 * | 11/2005 | Kirkeby et al. .............. 375/232 |

FOREIGN PATENT DOCUMENTS

| EP | 1 191 814 A1 | 3/2002 |
| JP | 2001-326991 A | 11/2001 |

OTHER PUBLICATIONS

Harma, A et al., Journal of the Audio Engineering Society, Audio Engineering Society, vol. 48, No. 11, Nov. 2000, pp. 1011-1031, XP001177399.

Harma, A., Signal Processing, vol. 80, No. 3, Mar. 2000, pp. 543-548, XP004188172.

(Continued)

*Primary Examiner*—Tan V Mai
(74) *Attorney, Agent, or Firm*—Birch, Stewart, Kolasch & Birch, LLP

(57) ABSTRACT

A digital filter includes at least a first and a second delayed summation line. One of the delay lines includes a warped finite impulse response (FIR) filter and the other line is a FIR filter. Midpoint elements from the first delayed summation line are used as input to the second delayed summation line. Output from the first delayed summation line is delayed with a delay corresponding to the total delay of the second delayed summation line and the delayed output from the first delayed summation line is added to output from the second delayed summation line to faun a new output.

6 Claims, 6 Drawing Sheets

OTHER PUBLICATIONS

Wang, Peng et al., IEEE, vol. 2, Jun. 5, 2000, pp. 913-916, XP010504872.
Kates, J.M. et al., Institute of Electrical and Electronics Engineers, Conference Record of the 37th Asilomar Conference on Signals, Systems & Computers, Nov. 9-12, 2003, vol. 1 of 2, conf. 37, Nov. 9, 2003, pp. 715-719, XP010701136.

Tyril, M. et al., Journal of the Audio Engineering Society, Audio Engineering Society, vol. 49, No. 1/2, Jan. 2001, pp. 36-43, XP001112483.
Karjalainen, M. et al., Applications of Signal Processing to Audio and Acoustics, 1997. 1997 IEEE ASSP Workshop, Oct. 19-22, 1997, p. 4pp, XP010248220.

* cited by examiner

Warped filter structure

DIGITAL FILTER HAVING A FIR FILTER AND A WARPED FIR FILTER, AND A LISTENING DEVICE INCLUDING SUCH A DIGITAL FILTER

AREA OF THE INVENTION

Traditional digital FIR filters have linear frequency resolution. Thus, these filters are not appropriate for matching the frequency resolution of the ear, nor for realizing demands for steep filter transitions in the low frequency area. Warped FIR filters can be designed to have nonlinear frequency resolution and are thus more appropriate for the described tasks.

In hearing aids and other sound processing devices, where the sound processing characteristics changes online, for instance in response to environmental changes different types of adaptive filter approaches or compression strategies are typically used to change the sound processing characteristics. In adaptive filters, FIR types have the advantage that they cannot become unstable, due to internal feedback in the filter, as it is known from adaptive IIR filters. Warped FIR filters do not suffer from the feedback problem as long as the warping parameter is numerically smaller than one.

Designing filters on a warped frequency axis is described by Makhoul and Cosell in 1976 and Strube in 1980. An overview of Frequency-Warped Signal Processing for Audio Applications is given by Härmä et al. 2000.

BACKGROUND OF THE INVENTION

From EP 1 191 814 A1 it is known to use a warped filter in a feedback adaptive filter approach, with the purpose of reducing howling or feedback, in the hearing aid. Also it is known to use the warped filtering technique for other applications, for instance including loudspeaker equalization, audio coding and adaptive feedback cancellation.

Further it has been proposed to use warped filtering in an online feed forward filter design approach in a hearing aid.

A regular FIR filter has the transfer function $H(z) = \Sigma_k h_k (z^{-1})^k$ delay line elements=$z^{-1}$ By replacing the delay elements with warped delay elements a warped FIR (WFIR) filter is obtained $F(z) = \Sigma_k g_k (w^{-1})^k$ delay line elements=$w^{-1}$ where $w = (1 - \lambda z^{-1})/(z^{-1} - \lambda)$ as shown in FIG. 1.

A warped FIR filter (WFIR) is shown in FIG. 1 with warped delay line elements $$w^{-1} = \frac{z^{-1} - \lambda}{1 - \lambda z^{-1}}$$

The warping parameter $0 \leq \lambda < 1$ determines the amount of warping. The filter $F(z)$ can be designed using regular FIR filter design techniques, e.g. the Fourier method, except the target frequencies are warped. A simple design example is shown in FIG. 2. Sample frequency is 20 kHz, $\lambda = 0.5$. The target filter is a triangular bandpass filter (in absolute magnitude) with passband from 166 Hz to 332 Hz.

The FIR and WFIR filters are designed by similar approaches, the only difference being that the WFIR filter is designed on a prewarped frequency axis and the FIR filter being designed on a linear frequency axis. The result is easily seen from FIG. 2. The warped filter can match the target better due to more frequency resolution for low frequencies. The FIR filter can not match the steep slopes of the target curve at frequencies below 500 Hz. The filter resolution achieved by the FIR filter at 500 Hz is already achieved in the WFIR filter at 167 Hz, when X is set to 0.5 at a 20 kHz sampling frequency.

It is easily shown, that the frequency resolution of the warped filter is increased by a factor determined by the warping parameter, namely the expansion at 0 Hz:

$$\Delta f(0) = \frac{1 + \lambda}{1 - \lambda}$$

For $\lambda = 0.5$ this factor is 3, which means that a warped FIR filter has a resolution at low frequencies comparable to a FIR filter which is 3 times longer (at the expense of resolution at the high frequencies).

The benefit of warped filters is that they can tune their frequency resolution to any frequency region needed. If high resolution is needed at high frequencies the $\lambda$ parameter must be set at for instance −0.5 relative to 0.5 when high resolution is wanted for low frequencies.

The cost for the increased flexibility is an increase in computational complexity. But when selecting $\lambda$ appropriately, for instance to 0.5 the increase in computational complexity is low.

Lower average throughput delay is achieved when matching WFIR and FIR filters of the same computational complexity. And the throughput delay is only high at those frequencies, where high flexibility is needed. In symmetric FIR filters, the throughput delay is constant across frequency. The frequency dependent throughput delay of symmetric warped FIR filters is only dependent on the warping parameter $\lambda$. Thus the symmetric WFIR filter has a constant phase, even though the filter coefficients are changed (as long as $\lambda$ is kept constant).

These known approaches do however not take advantage of the fall potential of the warped filter technique.

SUMMARY OF THE INVENTION

According to the invention the warped FIR filter and the FIR filters are combined in an attempt to get the "best of both worlds".

This is achieved with a digital filter comprising at least a first and a second delayed summation line, whereby one of the delay lines comprise a warped FIR filter and the other line is a FIR filter. According to the invention:

at least two delayed summation lines are present, midpoint elements from the first delayed summation line are used as input to the second delayed summation line, output from the first delayed summation line are delayed with a delay corresponding to the total delay of the second delayed summation line and the delayed output from the first delayed summation line is added to output from the second delayed summation line to form an output.

The idea is to let the warped filter process one part of the frequency range, for instance the lower frequencies, and to let the FIR filter process the remaining frequency range, in this case the high frequencies. This allows the FIR filter to be shorter, and the WFIR filter can operate with intensified warping so that it too will be shorter.

In the z-domain the filter structure according to the invention has the following expression:

$$y(z) = x(z)\left[z^{-r}\sum_{m=0}^{M-1} c_m w^{-m} + w^{-r}\sum_{j=0}^{J-1} d_j z^{-j}\right]$$

where the delay lines are tapped halfway as shown in FIG. 4 and FIG. 5, i.e.:

$$r = \frac{J-1}{2} \text{ and } m = \frac{M-1}{2}$$

Here the summation over w comprises the warping part of the filter and the summation over z comprises the FIE part of the filter.

In an embodiment of the invention the first delayed summation line is a warped summation line and the delay of the output of the first delayed summation line is a simple delay.

In another embodiment, the second delayed summation line is a warped summation line and the delay of the output of the first delayed summation line consists of warped delay elements.

In yet another embodiment the warped FIR filter comprises a number of warped filter sections, whereby midpoint elements of each section are used as input for the next section and where further the output of the same sections are delayed for in-phase summation with the output from the next section. Using this embodiment allows dedicated filtering of particular parts of the frequency axis defined by the warped filter segments.

The invention also comprises a listening device. The listening device is adapted to receive an input signal and has a signal path from the input to a receiver for delivering a sound signal to the ear of the user, where at least part of the signal path is digital and where the signal path comprises a digital filter as describe above.

If the listening device is a hearing aid it allows the hearing aid to realize Warped FIR filters which have a smaller group delay than similar traditional FIR filters with the same low frequency resolution. The difference is largest for high frequencies, where the delay through the digital WFIR filter can be considerably lower than for the FIR filter. In hearing aids it is very important to minimize the delay, since delays have a negative impact on the sound perception of the user. These negative effects can for instance be comb filter effects due to interactions between direct sound through the vent and the delayed and amplified sound from the hearing aid.

DESCRIPTION OF A PREFERRED EMBODIMENT

Figure 1:
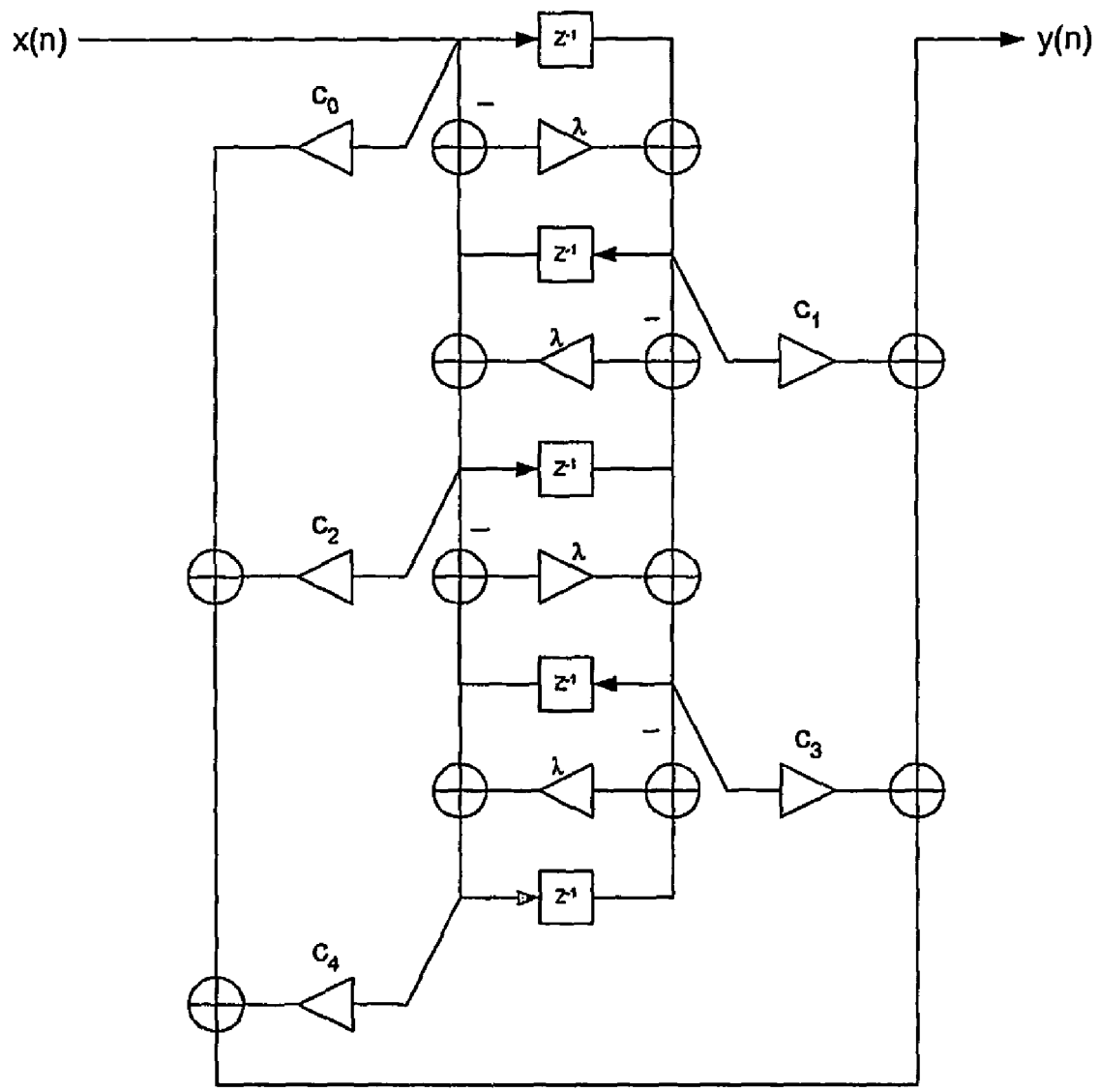
FIG. 1 Shows a warped FIR filter structure according to the prior art.
Figure 2:
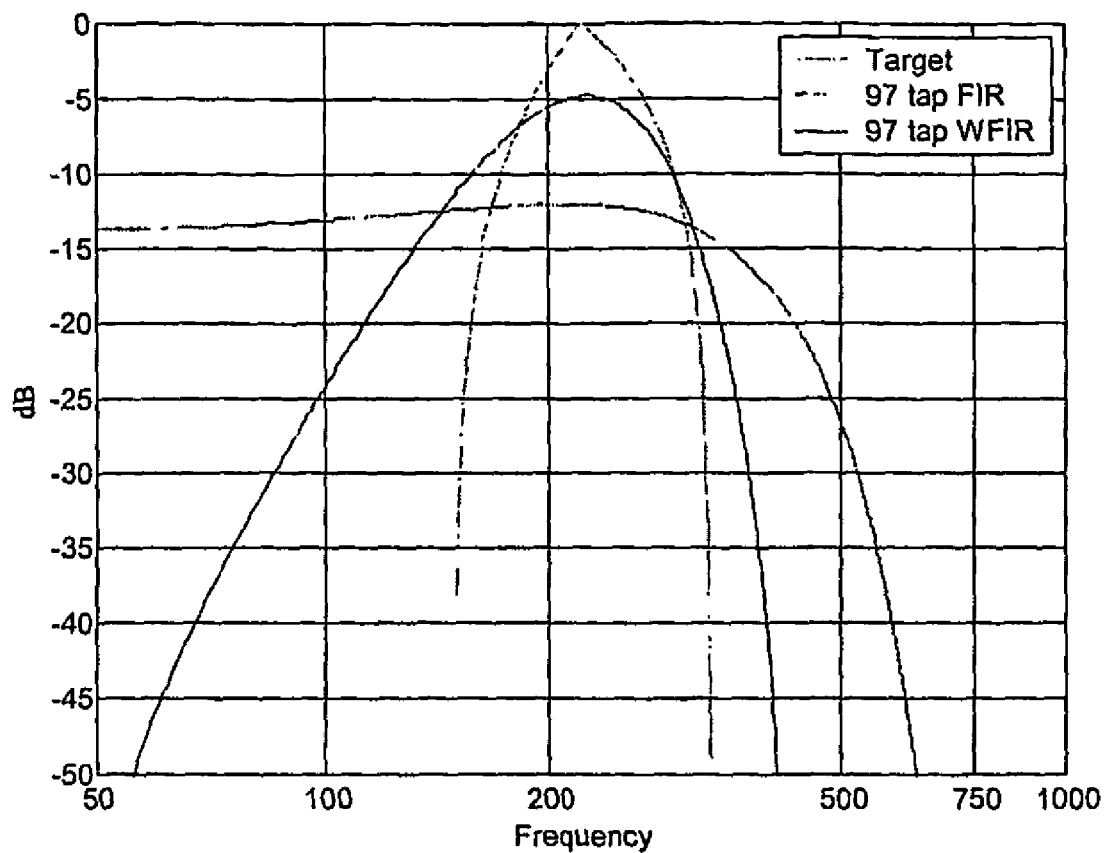
FIG. 2 is a diagram with the transfer functions for warped and regular FIR filters and target.
Figure 3:
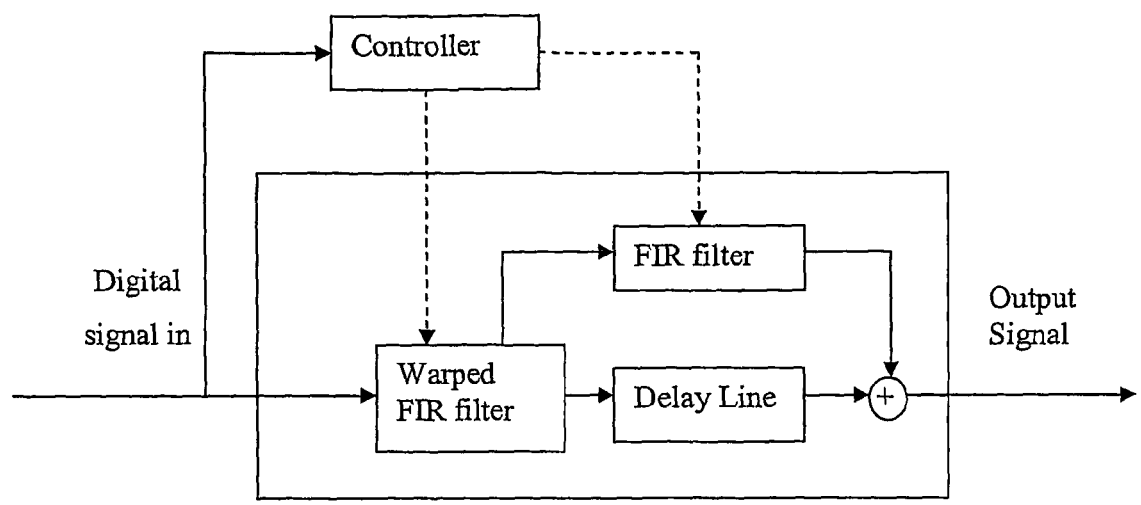
FIG. 3 shows a simple block diagram of the combined WFIR and FIR solution according to the invention, full lines indicate signal flow and dashed lines indicate parameter flow.

The use of the combined FIR and WFIR filter according to the invention in a feed forward adaptive filter approach is shown in FIG. 3. The controller feeds filter coefficients to the Warped FIR filter and the FIR filter online, and thus changes the characteristics of the hearing aid signal processing based on at least changes in the digitized input signal.

Figure 4:
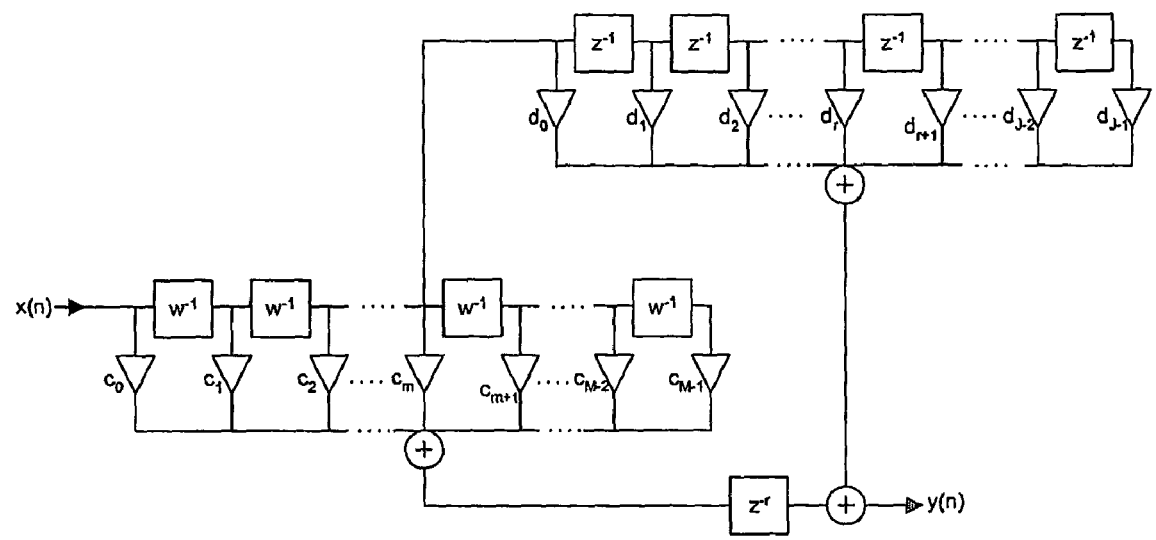
FIG. 4 is an example of parallel FIR (of order $2k$) and WFIR filter (of order $2p$) with matched phase.

The filter structure in FIG. 4 is designed according to the invention. $z^{-1}$ indicates a delay element with a delay of one sample, $z^{-k}$ indicates a delay element with a delay of k samples, and $w^{-1}$ indicates a warped delay element, with $w=(1-\lambda z^{-1})/(z^{-1}-\lambda)$. The warped delay line is tapped midway and fed as input to the FIR filter and a simple delay, matching that of the FIR filter, is placed at the output of the WFIR filter. This causes the two signal paths to match each other in phase, so that the adder at the output will not cause signals travelling the two paths to cancel out.

Figure 5:
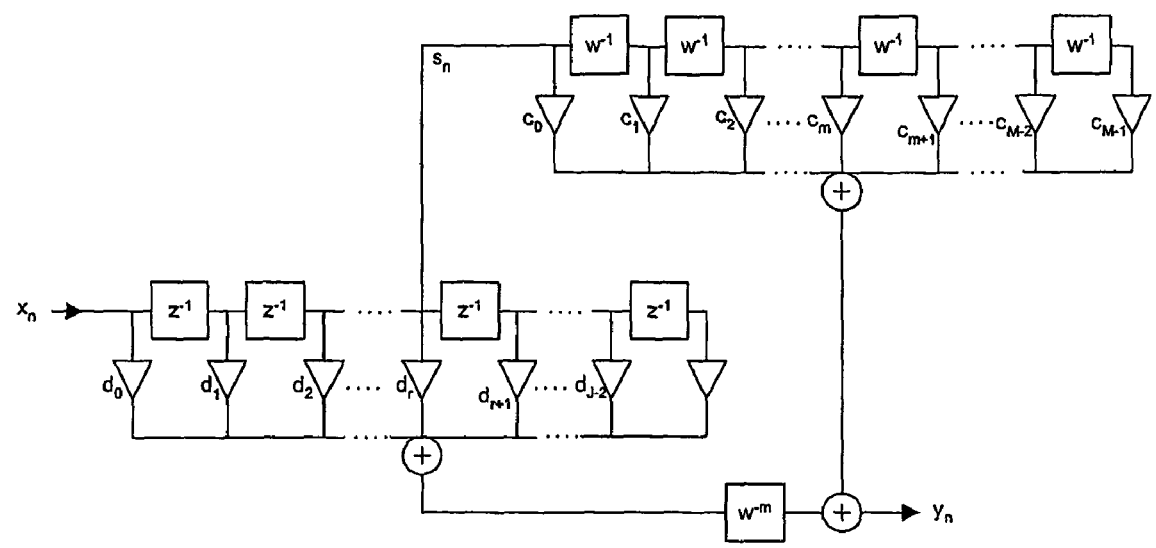
FIG. 5 is an example of parallel FIR (of order $2k$) and WFIR filter (of order $2p$) with matched phase, advantageous for special cases, for instance for small warped filter lengths.

In some cases (for small warped filter lengths), it may be an advantage to let the FIR and warped FIR filters trade places. This is illustrated in FIG. 5 where $z^{-1}$ indicates a delay element with a delay of one sample, $w^{-k}$ indicates a warped delay line with k warped delay elements, and $w=(1-\lambda z^{-1})/(z^{-1}-\lambda)$.

Figure 6:
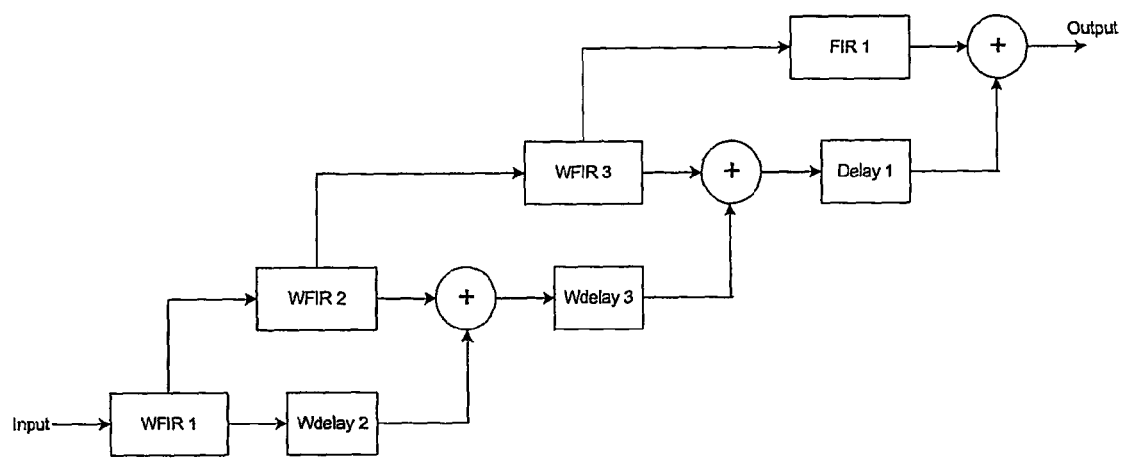
FIG. 6 shows a combination of 3 WFIR blocks and 1 FIR, block

In stead of having only one warped filter section, it is also possible to extend the combined WFIR and FIR structure, so that multiple WFIR sections with different warping parameters $\lambda$ is used to address different frequency regions. An example of such a solution is shown in FIG. 6.

The figure shows a combination of 3 WFIR blocks and 1 FIR block. This combination allows the use of 3 different warping parameters $\lambda$, which allows the WFIR filters to have different frequency resolution, allowing to match very specific needs on 3 different warped frequency scales, as well as on the traditional linear frequency scale.

The invention claimed is:

1. Digital filter comprising at least a first and a second delayed summation line, whereby one of the delay lines comprise a warped FIR filter and the other line is a FIR filter, whereby:
   at least two delayed summation lines are present,
   midpoint elements from the first delayed summation line are used as input to the second delayed summation line,
   output from the first delayed summation line are delayed with a delay corresponding to the delay of the second delayed summation line,
   the delayed output from the first delayed summation line is added to the output from the second delayed summation line to form a new output.

2. Digital filter as claimed in claim 1, whereby the first delayed summation line is a warped summation line and the delay of the output of the first delayed summation line is a simple delay.

3. Digital filter as claimed in claim 1, whereby the second delayed summation line is a warped summation line and the delay of the output of the first delayed summation line consists of warped delay elements.

4. Digital filter as claimed in any one of the preceding claims, wherein the warped FIR filter comprises a number of warped filter sections, whereby midpoint elements of each section are used as input for the next section and where further the output of the same sections are delayed for in-phase summation with output from the next section.

5. Listening or sound processing device, which is adapted to receive an input signal and has a signal path from the input to a receiver for delivering a sound signal to the ear of the user, where at least part of the signal path is digital and where the signal path comprises a digital filter as claimed in claims 1, 2 or 3 and where the signal path is controlled by a controller changing the characteristics of the signal path when there is a change in the input to the controller.

6. Listening or sound processing device, which is adapted to receive an input signal and has a signal path from the input to a receiver for delivering a sound signal to the ear of the user, where at least part of the signal path is digital and where the signal path comprises a digital filter as claimed in claim 4 and where the signal path is controlled by a controller changing the characteristics of the signal path when there is a change in the input to the controller.

\* \* \* \* \*